United States Patent
Hoecht et al.

(10) Patent No.: US 8,587,308 B2
(45) Date of Patent: Nov. 19, 2013

(54) SCALABLE MULTICHANNEL TRANSMITTER SYSTEM FOR AN MR TRANSMISSION ARRAY

(75) Inventors: Philipp Hoecht, Newton, MA (US); Wilfried Schnell, Frochheim (DE)

(73) Assignee: Siemens Aktiengesellschaft, Munich (DE)

( * ) Notice: Subject to any disclaimer, the term of this patent is extended or adjusted under 35 U.S.C. 154(b) by 485 days.

(21) Appl. No.: 12/876,335

(22) Filed: Sep. 7, 2010

(65) Prior Publication Data
US 2011/0057652 A1 Mar. 10, 2011

(30) Foreign Application Priority Data
Sep. 7, 2009 (DE) .................... 10 2009 040 391

(51) Int. Cl.
*G01V 3/00* (2006.01)
(52) U.S. Cl.
USPC .................................................. 324/309
(58) Field of Classification Search
USPC ............................................. 324/300–322
See application file for complete search history.

(56) References Cited

U.S. PATENT DOCUMENTS

| 5,248,943 | A | * | 9/1993 | Fox et al. ................ 324/322 |
| 5,483,158 | A | * | 1/1996 | van Heteren et al. ......... 324/318 |
| 5,565,779 | A | * | 10/1996 | Arakawa et al. ............. 324/318 |
| 6,362,622 | B1 | * | 3/2002 | Stauber et al. ............... 324/318 |
| 6,900,636 | B2 | | 5/2005 | Leussler |
| 6,943,551 | B2 | | 9/2005 | Eberler et al. |
| 6,969,992 | B2 | | 11/2005 | Vaughan et al. |
| 6,977,502 | B1 | * | 12/2005 | Hertz ........................... 324/318 |
| 7,400,148 | B2 | * | 7/2008 | Adachi ........................ 324/322 |
| 2003/0184293 | A1 | | 10/2003 | Boskamp et al. |

\* cited by examiner

Primary Examiner — Dixomara Vargas
(74) Attorney, Agent, or Firm — Schiff Hardin LLP

(57) ABSTRACT

A flexible design of a transmission system for a magnetic resonance tomography apparatus has multiple radio-frequency control units, connectors that are connected to the radio-frequency control units, a unit to which at least one first connector is connected, which connector is also connected to a first radio-frequency control unit of the radio-frequency control units. The unit is connected via a connector to only some—in particular only one—of the radio-frequency control units. One of these few radio-frequency control units is connected to an additional radio-frequency control unit via an additional connector.

8 Claims, 3 Drawing Sheets

Scalable multichannel transmitter system

SCALABLE MULTICHANNEL TRANSMITTER SYSTEM FOR AN MR TRANSMISSION ARRAY

BACKGROUND OF THE INVENTION

1. Field of the Invention

The invention concerns a transmission system for a magnetic resonance tomography apparatus.

2. Description of the Prior Art

Magnetic resonance apparatuses, in particular for the examination of patients via magnetic resonance tomography, are generally known (for example from DE10314215B4).

Modern magnetic resonance systems (also called MR or MRT) normally operate with multiple different antennas (also called coils in the following) to emit radio-frequency pulses for nuclear magnetic resonance excitation and/or to receive induced magnetic resonance signals. A magnetic resonance system often has a larger coil (known as a whole-body coil, also called a body coil) that is normally permanently installed in the apparatus, as well as multiple small surface coils (also called local coils). In contrast to the whole-body coil, surface coils serve to acquire detailed images of body parts or organs of a patient that are located relatively close to the body surface. The controller of the transmission coils of an MRT is also designated as the transmission system of the MRT.

A transmission system in which a central unit 1 transfers data or clock pulses to the plurality of modulators or, respectively, radio-frequency control units 2 that are used (as is also similarly shown in FIG. 2 of this application) is respectively known from DE 10124465A1 and U.S. Pat. No. 6,969,992. It is common to these proposals that at least one central unit 1 (the unit 106 in DE 10124465A1 or the unit 105 in U.S. Pat. No. 6,969,992) transfers data or clock pulses to the plurality of modulators or, respectively, radio-frequency control units 2 that are used.

Given a previously unconsidered, retroactive, marked increase of the number of transmission channels or RF control units, in arrangements that have previously been used internally it has been achieved (for example) that the central unit could be replaced by a unit with a higher number of output signal connections.

SUMMARY OF THE INVENTION

It is an object of the present invention to flexibly optimize the design of a transmission system for a magnetic resonance tomography system.

The invention is a transmission system for a magnetic resonance tomography apparatus with multiple radio-frequency control units, connectors that are connected to the radio-frequency control units, a unit to which a first connector is connected, which connector is also connected to a first radio-frequency control unit (from the cited radio-frequency control units), and wherein the unit is connected via respective connectors to only a few (in particular fewer than all) of the radio-frequency control units, which are connected directly or indirectly with the unit. These few radio-frequency control units are connected to an additional radio-frequency control unit via an additional connector.

For example, the unit can be a central clock pulse emitter or clock pulse relay or a data and signal distributor. According to one embodiment of the invention, the unit is connected via a first connector to only one first radio-frequency control unit of the radio-frequency control units, and this first radio-frequency control unit is connected via an additional connector to an additional radio-frequency control unit.

DESCRIPTION OF THE PREFERRED EMBODIMENTS

Figure 1:
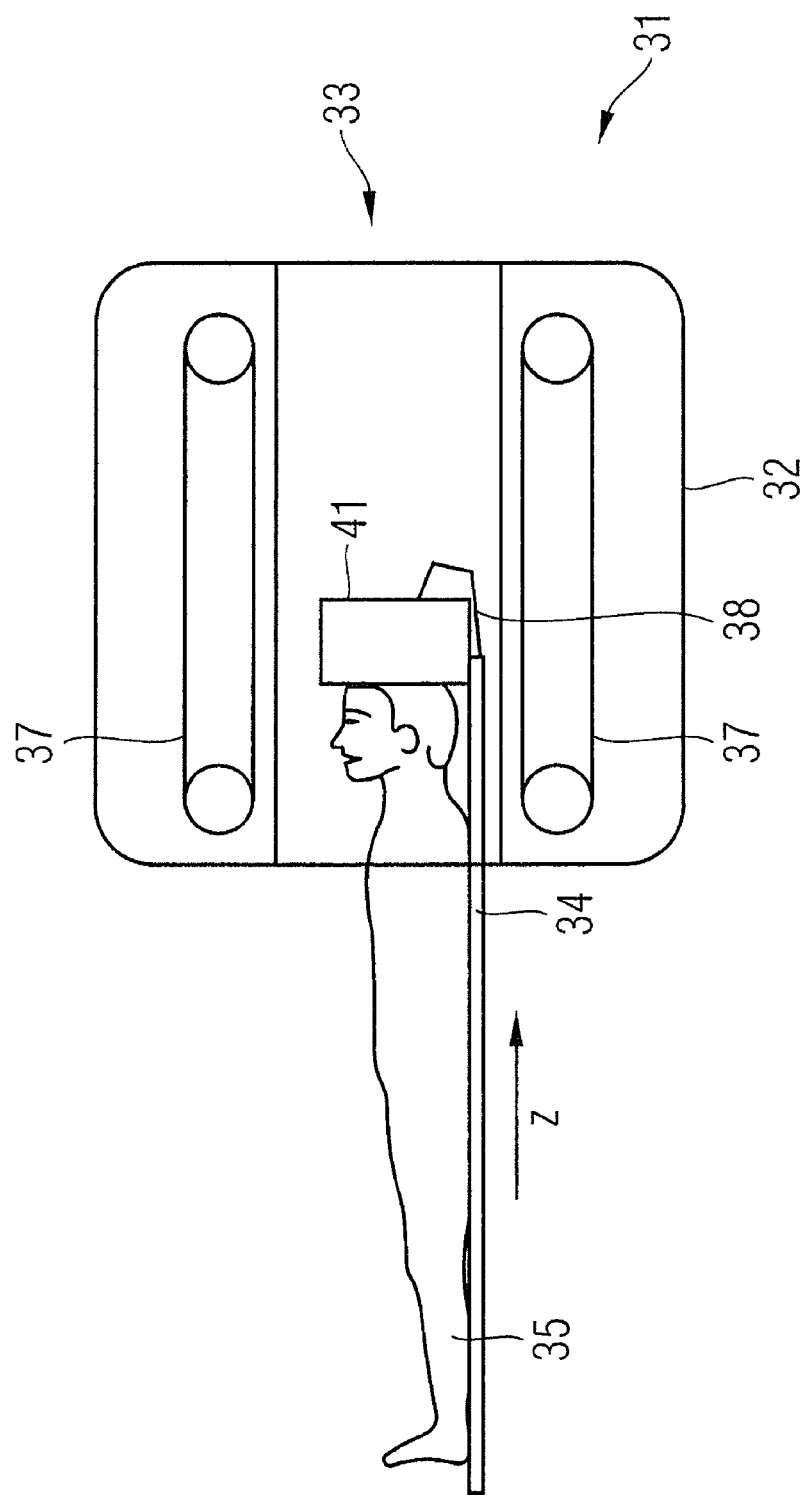
FIG. 1 schematically illustrates an MR system.

FIG. 1 shows a magnetic resonance apparatus MRT 31 with a whole-body coil 32 with a tube-shaped space 33 into which a patient bed 34 (for example with a subject or patient 35 and a local coil arrangement 38) can be driven in the direction of the arrow z in order to generate exposures of the subject or patient 35. Here a local coil array 38 (with multiple local coils and channels for signals from and/or to the local coils) is placed on the patient, with which local coil array 38 good exposures are enabled in a local region and whose signals can be evaluated (translated into images etc.) by a known evaluation device that can be connected via coaxial cables etc.

Figure 2:
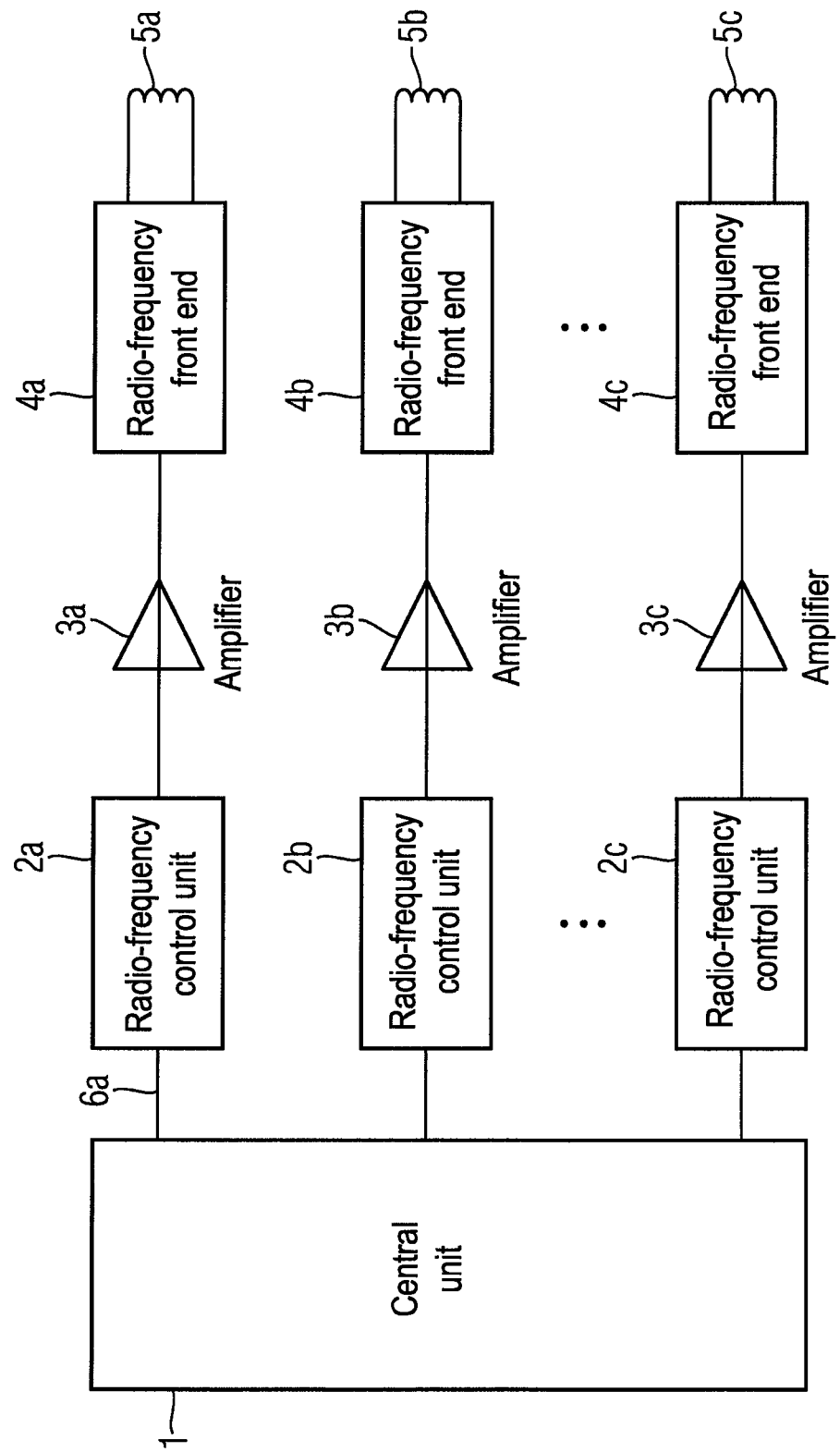
FIG. 2 schematically illustrates a transmission system for an MRT system according to internal prior art.

The generation of magnetic fields in an MRT via coils (gradient coils and/or a whole-body coil and/or local coils etc.) is controlled by a transmission system. In particular if multiple coils should be controlled, a multichannel transmission system can be used. According to FIG. 2 a multichannel transmission system can have a central unit 1 from which a number of clock signals, data and various types of other signals can be sent to radio-frequency control units 2a-2c that—based on these (synchronized with clock signals and/or using received data and consideration of various signals)—control radio-frequency front end systems 4a-4c via RF power amplifiers 3a-3c. The radio-frequency front end systems 4a-4c are respectively connected with one or more multichannel antennas 5a-5c that respectively generate desired magnetic fields.

Figure 3:
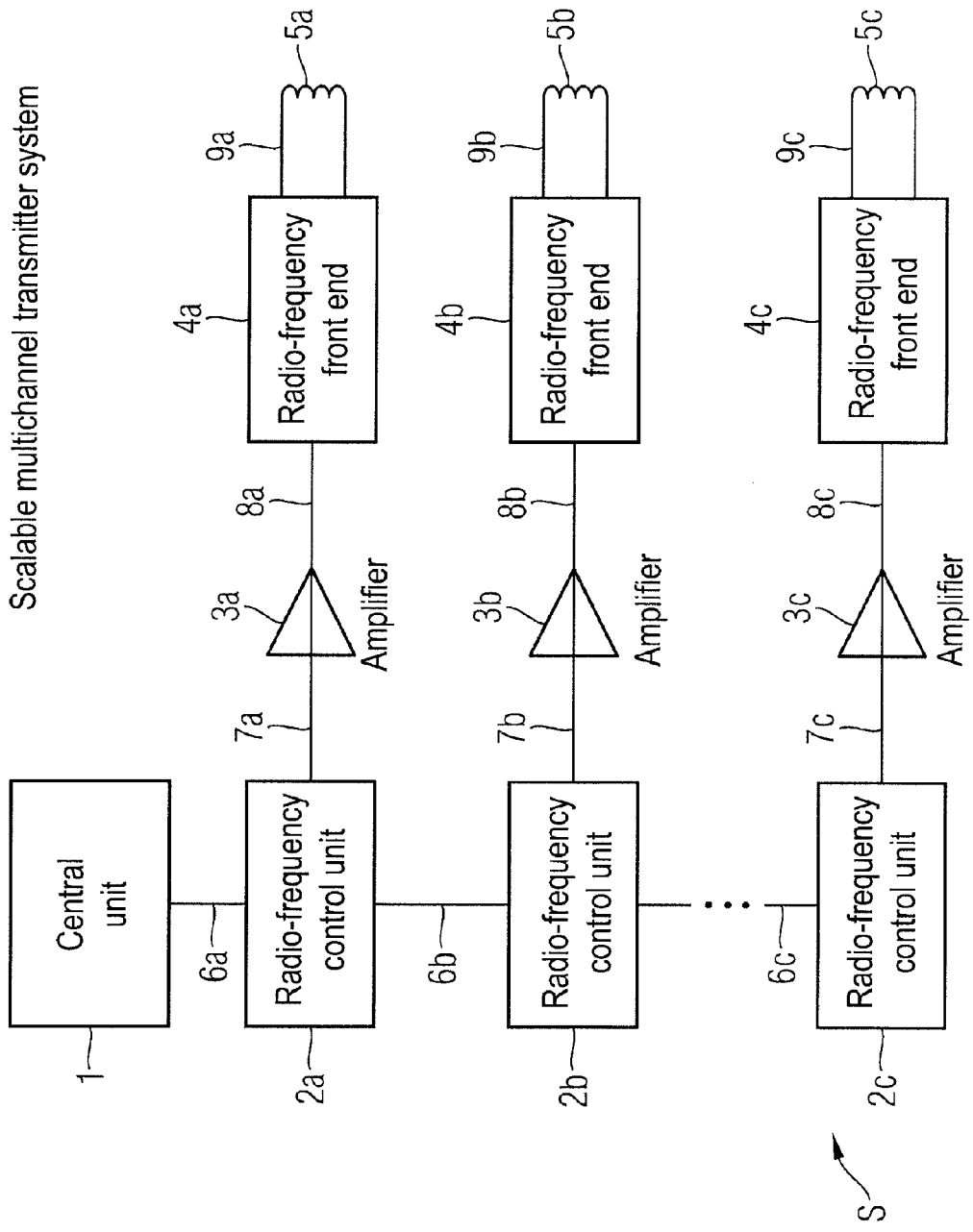
FIG. 3 schematically illustrates a transmission system according to one embodiment of the invention.

FIG. 3 shows an embodiment of a scalable multichannel transmitter system according to the invention in which the radio-frequency control units 2 are supplied with clock pulses, data and signals from the central unit 1 via serial chains. (6a, 6b, 6c, etc.).

The transmission system "S" in FIG. 3 for a magnetic resonance tomography apparatus has a transmission system with multiple radio-frequency control units 2a, 2b, 2c to which connectors 6a, 6b, 6c (for example connection lines) are connected, and a central unit 1 to which a first connector 6a is connected that is also connected to a first radio-frequency control unit 2a (one of the radio-frequency control units 2a, 2b, 2c).

The unit 1 is connected via a connector 6a to only some (here only to one, 2a) of the radio-frequency control units, and some (here only the one, 2a) of the radio-frequency control units connected with the unit 1 are (or is) connected to an additional radio-frequency control unit 2b via an additional connector 6b.

Here the central unit 1 is thus not connected with all radio-frequency control units 2a-2c but rather with only a smaller number of them, for example here with only one (2a). As shown in FIG. 3, additional radio-frequency control units 2b are connected not to the unit 1 (which is now less "central" with regard to the signal distribution in FIG. 3) but rather to radio-frequency control units 2a that are already connected with the unit 1. Signals or data or a clock pulse can thus be sent relayed from the unit 1 to multiple RF control units 2a-2c (instead of in a star topology according to FIG. 2) in that they are relayed from the RF control units 2a-2c to a (at least one) respective additional RF control unit.

One advantage of an embodiment according to the invention is that the central unit 1 would not be exchanged given a subsequent upgrade to the system. A more flexible scaling of the multichannel transmitter system is enabled by the design according to the invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A sending system for sending a signal to a local antenna of a magnetic resonance tomography apparatus, comprising:

a plurality of radio-frequency control units each configured to respond to an input signal to emit an output signal that participates in causing generation of an electromagnetic field, by at least one radio-frequency antenna of a magnetic resonance tomography apparatus, designed to excite nuclear spins in a subject, said plurality of radio-frequency controls units including a first of said radio-frequency control units;

a plurality of connectors that respectively supply said input signal to the respective radio-frequency control units, said plurality of connectors including a first of said connectors;

a central unit configured to serve as a source of said input signal, said central unit being connected only to a subset of said plurality of radio-frequency control units that is less than all of said radio-frequency control units, said central unit being at least connected via said first of said connectors to said first of said radio-frequency control units to supply said input signal to said first of said radio-frequency control units, and one of said radio-frequency control units in said subset being connected to another radio-frequency control unit in said plurality of radio-frequency control units via another connector in said plurality of connectors that proceeds from said first of said radio-frequency control units to said another of said radio-frequency control units, to supply said input signal from said first of said radio-frequency control units to said another of said radio-frequency control units.

2. A sending system as claimed in claim 1 wherein said subset consists solely of said first of said radio-frequency control units, and wherein said first of said radio-frequency control units is connected to another of said radio-frequency control units via one further connector in said plurality of connectors.

3. A sending system as claimed in claim 1 wherein said first of said radio-frequency control units is connected to only one other radio-frequency control unit via said another connector.

4. A sending system as claimed in claim 1 wherein said central unit and said radio-frequency control units are configured to transmit clock signals via said plurality of connectors.

5. A sending system as claimed in claim 1 wherein said central unit and said radio-frequency control units are configured to transmit data signals via said plurality of connectors.

6. A sending system as claimed in claim 1 wherein each connector is an electrical connection line.

7. A sending system as claimed in claim 1 comprising a plurality of amplifiers respectively connected to the respective outputs of said radio-frequency control units.

8. A sending system as claimed in claim 7 comprising a plurality of radio-frequency antennas respectively connected to said amplifiers, said central unit and said plurality of radio-frequency control units being configured to cause each of the respective antennas to emit an electromagnetic field that excites said nuclear spins.

* * * * *